United States Patent [19]

Holmes

[11] 4,404,652

[45] Sep. 13, 1983

[54] SIDE FEED EXPANDER

[75] Inventor: Richard D. Holmes, San Jose, Calif.

[73] Assignee: International Business Machines Corporation, Armonk, N.Y.

[21] Appl. No.: 296,620

[22] Filed: Aug. 27, 1981

[51] Int. Cl.³ .............................................. G11C 19/08
[52] U.S. Cl. .......................................... 365/8; 365/43
[58] Field of Search ..................................... 365/8, 43

[56] References Cited

U.S. PATENT DOCUMENTS

| | | | |
|---|---|---|---|
| 3,702,995 | 11/1972 | Bobeck et al. | 365/8 |
| 3,810,132 | 5/1974 | Bobeck | 365/8 |
| 3,953,840 | 4/1976 | Cutler et al. | 365/7 |
| 4,031,526 | 6/1977 | Archer et al. | 365/8 |
| 4,094,004 | 6/1978 | Dimyan | 365/8 |
| 4,120,046 | 10/1978 | Chen | 365/8 |

Primary Examiner—James W. Moffitt
Attorney, Agent, or Firm—Joseph E. Kieninger

[57] ABSTRACT

A side feed expander for magnetic bubble devices is disclosed. The side feed expander includes a row of expander elements and an input propagation element associated with one of the sides of an expander element in the row of expander elements. In a preferred embodiment, the input element is associated with the apex portion on one side of one of the expander elements. In another embodiment one propagation element is associated with the side of an expander element on one end of the row of the expander and a second propagation element is associated with the side of an expander element positioned on the other end of the row. A side expander permits the dummy sensor to be positioned in several positions, including the opposite end of the expander from where the active sensor is located.

9 Claims, 4 Drawing Figures

SIDE FEED EXPANDER

DESCRIPTION

1. Technical Field

This invention relates to expanders for magnetic bubble devices and more particularly to a side feed expander element.

2. Background Art

Magnetoresistive bubble expanders for use in the detection of magnetic bubble domains are described in U.S. Pat. Nos. 3,702,995; 3,810,132; 3,953,840; 4,094,004; 4,031,526; and 4,120,046. Typically, an expander detector device consists of a number of permalloy elements arranged to distort the cylindrical shape of a magnetic bubble incident on the expander into a more elongated configuration. The expansion of the bubble is accomplished by positioning a number of distinct columns or rows of permalloy elements (typically chevron-shaped elements) in either a triangular or rectangular arrangement on a magnetic wafer which supports the magnetic domains. In the early devices, these elements were positioned in a triangular arrangement, whereas later devices utilize a rectangular arrangement.

Under the influence of an applied rotating field, magnetic bubbles in a data stream from the read channel are induced to propagate from the last element of the read channel into the end of one of the chevrons in the first column of the expander. All of the prior art expanders described in the above-identified patents operate in this manner, that is, bubbles enter the first column of chevron elements at the end of one of the chevron elements. A bubble propagating under the expander device is stretched out by the magnetic interaction with the columns. Detection is accomplished by sensing the electrical resistance of one of the permalloy columns. When an elongated magnetic bubble passes under the detector, the resistance of the detection column is altered by the interaction of the bubble field with the fields of the permalloy elements, thereby indicating the presence of a bubble.

In order to eliminate noise, a dummy sensor is positioned behind or on the output side of the detector. While the dummy sensor improves the signal-to-noise ratio, it does, however, impose limitations on the design configuration in that it must be located on the output side of the detector.

There are several other disadvantages of the expander detector design described in the prior art patents. One disadvantage is that these designs restrict the propagation of the bubble into the end of the front row of the expander. Another disadvantage is the so-called front end effect, that is, where the bubble enters the expander. This front end effect decreases the upper margin because the stripe has a tendency to collapse in the front row of the expander.

SUMMARY OF THE INVENTION

It is a primary object of this invention to provide an improved bubble expander.

It is another object of this invention to provide an expander wherein the input is not restricted to being located at the ends thereof.

It is still another object of this invention to provide an expander having a dummy sensor that is not restricted to being located on the output side of the detector.

It is a further object of this invention to eliminate the collapse of bubbles in the input end of the expander.

These and other objects are accomplished with a side feed expander. The side feed expander includes a row of expander elements and an input propagation element associated wih one of the sides of an expander element in the row of expander elements. In a preferred embodiment, the input element is associated with the apex portion on one side of one of the expander elements. In another embodiment, the propagation element is associated with the side of a leg of the expander element. In another embodiment one propagation element is associated with the side of an expander element on one end of the row of the expander and a second propagation element is associated with the side of an expander element positioned on the other end of the row. A side expander permits the dummy sensor to be positioned in several positions, including the opposite end of the expander from where the active sensor is located.

Other objects of this invention will be apparent from the following detailed description, reference being made to the following drawings wherein the specific embodiments of the invention are shown.

DESCRIPTION OF THE PREFERRED EMBODIMENT

Figure 1:
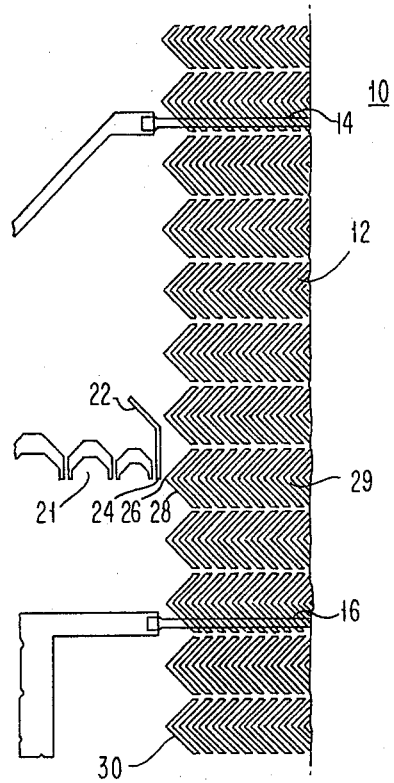
FIG. 1 is a top view of an expander detector element in accordance with this invention.

As shown in FIG. 1, an expander detector 10 includes an expander region 12, an active sensor 14 and a dummy sensor 16. A read channel 21 has an input propagation element 22 with an end portion 24 associated with an apex or middle region 26 of the side chevron element 28 in one 29 of the rows of chevrons in expander portion 12. The input progagation element 22 may have the shape of a hockey stick as shown in FIG. 1.

A bubble from read channel 21 propagates from the end 24 to the apex or middle region 26 and into the expander portion where it expands and is propagated towards the active sensor 14. The input element 22 may be positioned wherever convenient along any particular row of chevron elements in the expander portion 12. In FIG. 1, the input propagation element 28 is positioned so that a bubble may enter the fifth row of chevrons from the end of the device 10, i.e. row 29. This is in contrast to the prior art devices in which it was required that the input element 22 be associated with the end of the chevrons in the first row 30 at end of the device 10. One of the advantages of being positioned by a row other than row 30, the first row of the device, is that there is no "front end" effect where the stripe has a tendency to collapse. Eliminating the "front end" effect increases the upper margin.

The embodiment shown in FIG. 1 also permits flexibility in design since it is possible to position the dummy sensor 16 at the other end of the device 10 which is away from the end having the active sensor 14. This design permits higher margin, eliminates the "front end" effect and provides flexibility for the design of the bubble chip.

Figure 2:
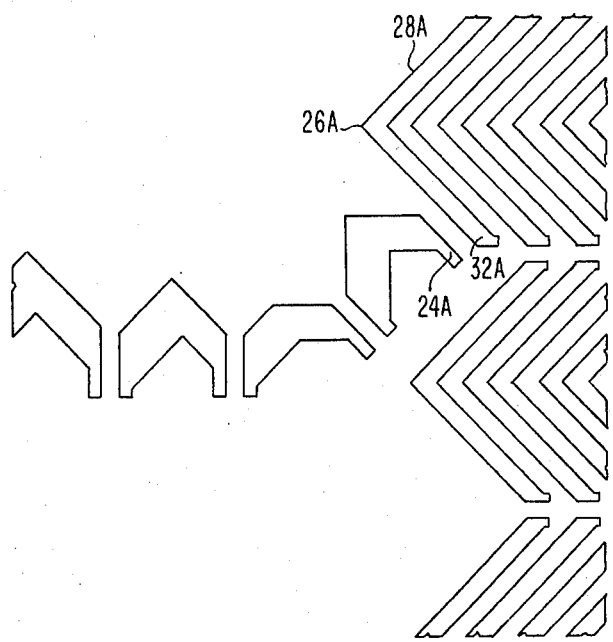
FIG. 2 is a top view of a second embodiment of this invention.

Another embodiment is shown in FIG. 2 in which an input propagation element 22A is positioned so that it is parallel to the side of let 32A of chevron 28A. The bubble in this case propagates from the end portion 24A through the side of 28A to the end 32A. Thus, in both FIG. 1 and FIG. 2, the bubbles enter the expander 12 on the side of the expander 12 where the chevron element 28, 28A has its apex or middle region 26, 26A pointed, respectively.

Figure 3:
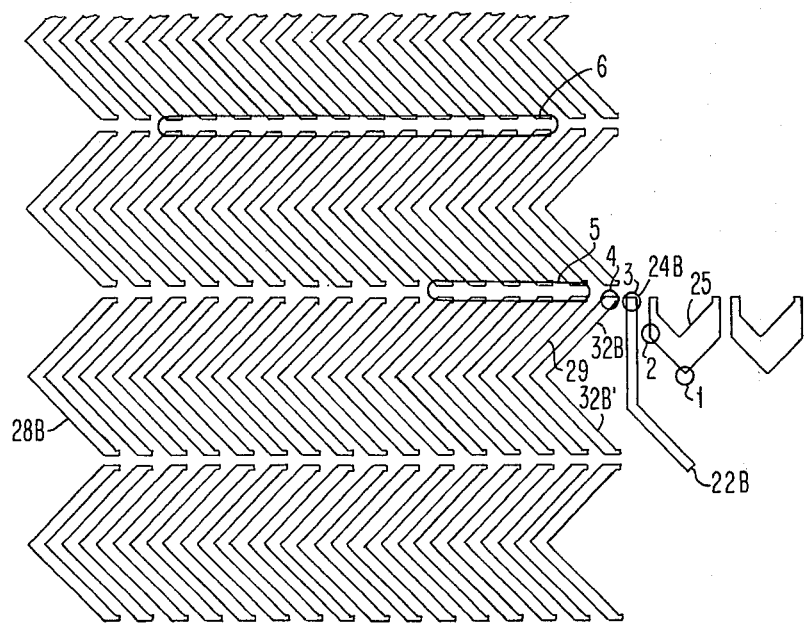
FIG. 3 is a top view of a third embodiment of this invention.

FIG. 3 illustrates an embodiment of this invention in which a bubble may be transferred to the side of the chevron at the other end of the row 29 in expander portion 12. A bubble at position 1 on element 25 moves to bubble position 2 on the same element 25, due to the rotation of the magnetic field. The bubble then goes to position 3 on the end portion 24B of input element 22B. A bubble then propagates to position 4 on the side of leg 32B. The bubble expands to position 5 and later to position 6. Thus, in FIG. 3, the bubbles enter the expander 12 on the side of the expander 12 where the chevron element 28B has its legs 32B and 32B' pointed.

Figure 4:
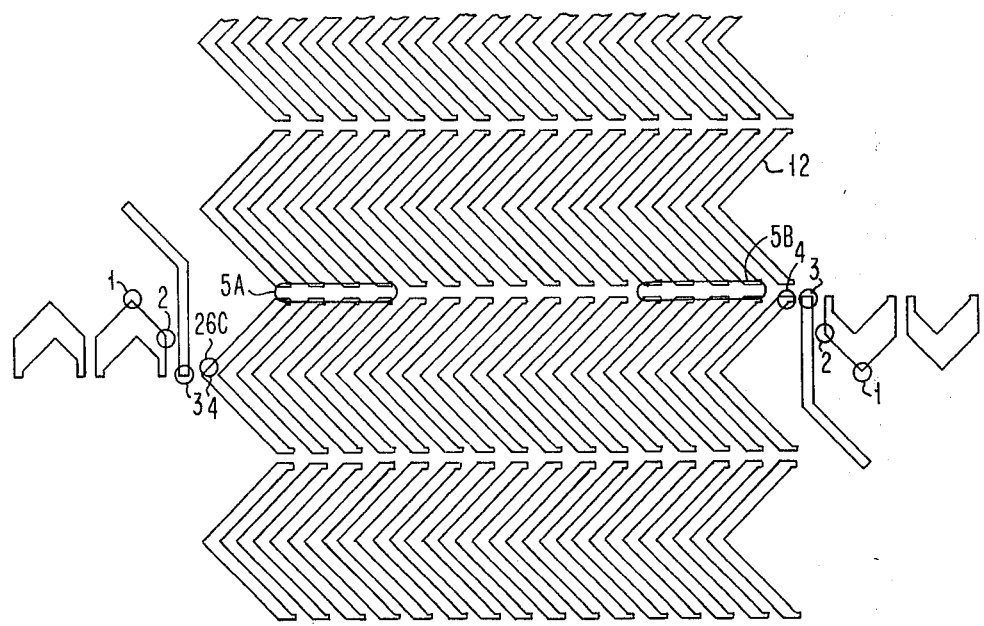
FIG. 4 is a top view of a fourth embodiment in accordance with this invention.

The embodiment shown in FIG. 4 introduces bubbles from both sides of the expander. In this case, a bubble may be propagated from element 25C to the input element end portion 24C and then to position 4 on the apex or middle region 26C. The bubble will then stripe out to position 5A. On a different cycle a bubble may also be propagated from element 25D to input element end portion 24D and then to position 4 on the side of leg 32D. The bubble will then stripe out to position 5B.

Although preferred embodiments have been described, it is understood that numerous variations may be made in accordance with the principles of this invention.

I claim:

1. The combination comprising:
   at least two expander bubble propagation elements arranged in a first row of an expander and having their surfaces uniformly spaced in juxtaposition including a first element at one end of said row and a second element at the other end of said row, said first expander element having a first side with a middle portion and first and second end portions, said second expander element having a first side with a middle portion and first and second end portions,
   an input bubble propagation element associated with one of said first sides in said first row,
   a second row of bubble propagation elements positioned in said expander on a first side of said first row, and
   a third row of bubble propagation elements positioned in said expander on the second side of said first row whereby a bubble propagating from said input element to one of said expander elements first sides will expand to form a stripe in said expander.

2. The combination as described in claim 1 wherein said expander elements are chevrons.

3. The combination as described in claim 1 wherein said input element faces and is associated with said first side of said first expander element.

4. The combination as described in claim 1 wherein said input element is associated with said middle portion of said first side of said first expander element.

5. The combination as described in claim 1 wherein said input element has the shape of a hockey stick.

6. The combination as described in claim 1 wherein said input element is associated with said first end portion of said first side of said first expander element.

7. The combination as described in claim 1 wherein said input element has a first side which is parallel to a portion of said first side of said first expander element.

8. The combination as described in claim 1 including a second input bubble propagation element associated with said first end portion of said first of said second expander element.

9. The combination comprising
   at least two expander bubble propagation elements arranged in a first row of an expander and having their surfaces uniformly spaced in juxtaposition including a first element at one end of said row and a second element at the other end of said row, said first expander element having a first side with a middle portion, a first end portion and a second end portion, said second expander element having a first side with a middle portion, a first end portion and a second end portion,
   an input bubble propagation element associated with one of said first sides in said first row,
   an active sensor positioned in said expander on a second row located on a first side of said first row, and
   a dummy sensor positioned in said expander on a third row located on the second side of said first row whereby a bubble propagating from said input element to one of said expander element first sides will expand to form a stripe which is sensed by said active sensor.

* * * * *

Notice of Adverse Decision in Interference

In Interference No. 101,215, involving Patent No. 4,404,652, R. Holmes, SIDE FEED EXPANDER, final judgment adverse to patentee was rendered Dec. 11, 1984, as to claims 1, 2, 3, 6, and 7.

[*Official Gazette April 30, 1985.*]